(12) United States Patent
Park et al.

(10) Patent No.: US 7,701,747 B2
(45) Date of Patent: Apr. 20, 2010

(54) NON-VOLATILE MEMORY INCLUDING SUB CELL ARRAY AND METHOD OF WRITING DATA THERETO

(75) Inventors: Joon-min Park, Seoul (KR);
Sang-beom Kang, Hwaseong-si (KR);
Woo-yeong Cho, Suwon-si (KR);
Hyung-rok Oh, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/958,432

(22) Filed: Dec. 18, 2007

(65) Prior Publication Data

US 2008/0165566 A1 Jul. 10, 2008

(30) Foreign Application Priority Data

Jan. 4, 2007 (KR) .................... 10-2007-0001180

(51) Int. Cl.
*G11C 7/00* (2006.01)
(52) U.S. Cl. .................... 365/148; 365/230.03
(58) Field of Classification Search ........... 365/148, 365/230.03
See application file for complete search history.

(56) References Cited

U.S. PATENT DOCUMENTS

| | | | |
|---|---|---|---|
| 4,862,459 A * | 8/1989 | Fukushima ............... 714/721 |
| 6,909,632 B2 | 6/2005 | Rinerson et al. | |
| 6,917,539 B2 * | 7/2005 | Rinerson et al. ............ 365/171 |
| 6,999,854 B2 * | 2/2006 | Roth .......................... 700/282 |
| 2003/0198080 A1 * | 10/2003 | Iwata ......................... 365/158 |
| 2004/0001351 A1 * | 1/2004 | Subramanian et al. ...... 365/158 |
| 2004/0125648 A1 * | 7/2004 | Iwata ......................... 365/158 |
| 2005/0174840 A1 | 8/2005 | Tsushima et al. | |
| 2007/0268742 A1 * | 11/2007 | Liu ............................. 365/163 |

FOREIGN PATENT DOCUMENTS

| JP | 2004-186553 | 7/2004 |
|---|---|---|
| JP | 2006-099866 | 4/2006 |
| JP | 2006-099882 | 4/2006 |

* cited by examiner

*Primary Examiner*—Michael T Tran
(74) *Attorney, Agent, or Firm*—Volentine & Whitt, P.L.L.C.

(57) ABSTRACT

A non-volatile memory device, in which data values are determined by polarities at cell terminals, includes a memory cell array. The memory cell array is divided into multiple sub cell arrays, each sub cell array including at least one input/output line and an X-decoder/driver. First input/output lines included in different sub cell arrays may be simultaneously activated and bias voltages may be applied to the activated first input/output lines in accordance with the data values. The non-volatile memory device may be a bi-directional resistive random access memory (RRAM).

17 Claims, 6 Drawing Sheets

NON-VOLATILE MEMORY INCLUDING SUB CELL ARRAY AND METHOD OF WRITING DATA THERETO

CROSS-REFERENCE TO RELATED PATENT APPLICATION

A claim of priority is made to Korean Patent Application No. 10-2007-0001180, filed on Jan. 4, 2007, the subject matter of which is hereby incorporated by reference.

BACKGROUND OF THE INVENTION

1. Field of the Invention

The present invention relates to non-volatile memory, and more particularly, to a non-volatile memory including sub cell arrays respectively including X-decoders/drivers for simultaneously writing data values, and a method of writing data to the non-volatile memory.

2. Description of the Related Art

Next generation memory demands highly integrated dynamic random access memory (DRAM), non-volatile flash memory and high-speed static random access memory (SRAM). Currently, phase-change random access memory (PRAM), nano-floating gate memory (NFGM), polymer random access memory (PoRAM), magnetic random access memory (MRAM), ferro-electric random access memory (FRAM), resistive random access memory (RRAM) and the like are regarded as next generation memory which meet the above demands.

FIG. 1 is a schematic view of a cell structure of a conventional bi-directional RRAM.

Referring to FIG. 1, the bi-directional RRAM includes a non-ohmic device and a resistance variable device. In the RRAM, data is written using resistance-value variations of the resistance variable device. The resistance variable device includes a resistance variable substance between first and second electrodes.

The resistance value of the resistance variable substance varies in accordance with an applied voltage or an applied current. In uni-directional RRAM, the resistance value varies in accordance with the amount of applied voltage or applied current. In comparison, in the bi-directional RRAM, the resistance value varies in accordance with the amount and the direction of applied voltage or applied current.

The bi-directional RRAM illustrated in FIG. 1 realizes bi-directivity as described above by including the non-ohmic device. The non-ohmic device is in a high-resistant state in a predetermined voltage range $V_{NO-}$ to $V_{NO+}$ (e.g., $-3V$ to $3V$). Accordingly, a current is not applied to the resistance variable device. On the other hand, the non-ohmic device is in a low-resistant state outside of the predetermined voltage range of $-3V$ to $3V$. Accordingly, a current is applied to the resistance variable device. U.S. Pat. No. 6,909,632 discloses an example of a bi-directional RRAM including a non-ohmic device and a resistance variable device in more detail.

FIG. 2 is a graph illustrating cell characteristics of the conventional bi-directional RRAM illustrated in FIG. 1.

Referring FIGS. 1 and 2, when a writing voltage $V_W$ of 6V is applied to the resistance variable substance, a corresponding cell has a first resistance. In comparison, when a writing voltage $-V_W$ of $-6V$ is applied to the resistance variable substance, a corresponding cell has a second resistance.

In the bi-directional RRAM, a data value "1" can be set when a cell has the first resistance and a data value "0" can be set when the cell has the second resistance. That is, in the bi-directional RRAM, the data values "1" and "0" can be written using the writing voltages $V_W$ and $-V_W$, wherein the magnitudes of the writing voltages $V_W$ and $-V_W$ at both ends or terminals of the cell, respectively, are the same but the polarities are different.

FIGS. 3A and 3B are schematic views illustrating operations of writing data to a cell of the conventional bi-directional RRAM illustrated in FIG. 1.

Referring to FIG. 3A, a data value "0" is written to a cell (indicated by a circle) by applying 3V to a word line WL and $-3V$ to a bit line BL. On the other hand, a data value "1" is written to the cell by applying $-3V$ to the word line WL and 3V to the bit line BL. Here, 0V is respectively applied to an unselected word line WL' and an unselected bit line BL'.

Referring to FIG. 3B, a data value "0" is written to a cell by applying 6V to a word line WL, 0V to a bit line BL, and 3V respectively to an unselected word line WL' and an unselected bit line BL'. On the other hand, a data value "1" is written to the cell by applying $-6V$ to the word line WL, 0V to the bit line BL, and $-3V$ respectively to the unselected word line WL' and the unselected bit line BL'.

However, when data is written by applying the writing voltages $V_W$ and $-V_W$ (e.g., $V_W=6V$, $-V_W=-6V$) to a word line WL or a bit line BL as shown in FIG. 3B, the voltage of an unselected word line WL' and an unselected bit line BL' changes in accordance with the data value. Thus, it is more efficient to write the data by applying ½ writing voltages ½$V_W$ and $-½V_W$ (e.g., ½$V_W=3V$, $-½V_W=-3V$) to the word line WL or the bit line BL as shown in FIG. 3A.

For convenience of explanation, a bi-directional RRAM that operates as shown in FIG. 3A will be described below.

FIG. 4 is a detailed view illustrating the writing operation illustrated in FIG. 3A.

Referring to FIG. 4, multiple input/output lines IO0 through IO15 commonly include multiple word lines WLi and WLj. That is, all the input/output lines IO0 through IO15 of a memory cell array share one X-decoder and one driver.

However, bias voltages ½$V_W$ and $-½V_W$ (½$V_W=3V$, $-½V_W=-3V$) having opposite polarities as shown in FIG. 3A cannot be simultaneously applied to one word line, such as the word line WLi. Accordingly, if any of the input/output lines IO0 through IO15, which share the same word line, has a different data value to be written, data cannot be simultaneously written to all the input/output lines IO0 through IO15.

SUMMARY OF THE INVENTION

According to an aspect of the present invention, there is provided a non-volatile memory device, in which data values are determined by polarities at cell terminals. The non-volatile memory device includes a memory cell array divided into multiple sub cell arrays, each sub cell array including at least one input/output line and an X-decoder/driver.

The X-decoder/driver may activate a corresponding word line and apply bias voltages to the activated word line in accordance with the data values.

Each sub cell array may include one input-output line. Each sub cell array may further include a Y-decoder/driver corresponding to the one input/output line. The non-volatile memory device may simultaneously activate the one input/output line included in each sub cell array, and apply bias voltages to the activated input/output lines in accordance with the data values respectively corresponding to the input/output lines.

Each sub cell array may include multiple input-output lines. For example, each sub cell array may include four input-output lines. Each sub cell array may further include multiple Y-decoders/drivers corresponding to the multiple input/output lines. The input/output lines in each sub cell array may include a first input/output line, and the non-volatile memory device may simultaneously activate the first input/output lines included in the sub cell arrays, and apply bias voltages to the activated input/output lines in accordance with the data values respectively corresponding to the input/output lines. Also, the non-volatile memory device may sequentially activate the input/output lines included within each sub cell array.

The bias voltages may correspond to writing voltages of the data values. The magnitudes of the writing voltages may be the same and polarities of the writing voltages may be different.

The non-volatile memory device may be a bi-directional resistive random access memory (RRAM). The bi-directional RRAM may include a cell structure having a non-ohmic device and a resistance variable device. The non-ohmic device may operate as a high-resistant material when voltages at the cell terminals are in a predetermined range and may operate as a low-resistant material when the voltages at the cell terminals are outside the predetermined range. The resistance variable device may have a different resistance value in accordance with the polarities at the cell terminals when the non-ohmic device has a low resistance.

According to another aspect of the present invention, there is provided a method of writing data to a non-volatile memory device, in which data values are determined by polarities at cell terminals. The method includes simultaneously activating multiple first input/output lines included in different sub cell arrays and applying bias voltages to the activated first input/output lines in accordance with the data values. The method further includes activating multiple word lines included in the different sub cell arrays and applying bias voltages to the activated word lines in accordance with the data values.

Each sub cell array may include multiple input/output lines which share multiple word lines included in each sub cell array. The method may further include sequentially activating each of the input/output lines included in a sub cell array.

BRIEF DESCRIPTION OF THE DRAWINGS

The accompanying drawings are included to provide a further understanding of the invention. The drawings illustrate example embodiments of the present invention, described with reference to the attached drawings, in which.

DETAILED DESCRIPTION OF THE EMBODIMENTS

Figure 1:
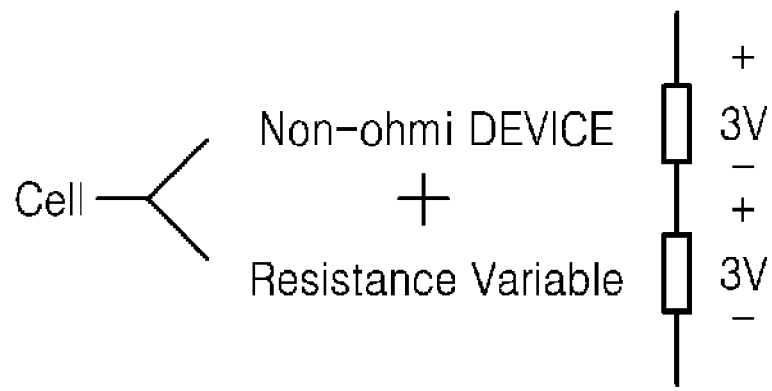
FIG. 1 is a schematic view of a cell structure of a conventional bi-directional resistive random access memory (RRAM)
Figure 2:
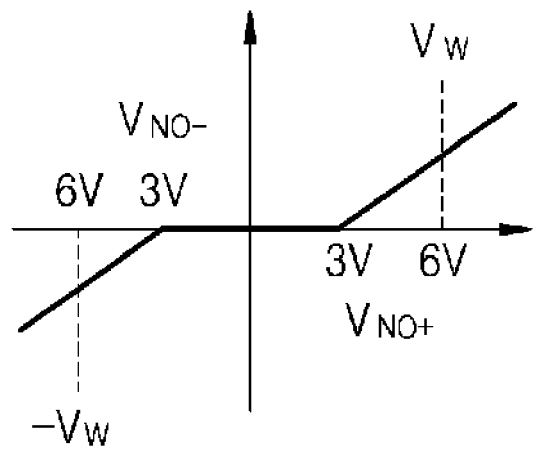
FIG. 2 is a graph illustrating cell characteristics of the conventional bi-directional RRAM illustrated in FIG. 1.

The present invention will now be described more fully with reference to the accompanying drawings, in which illustrative embodiments of the invention are shown. Specific structural and functional details disclosed herein are merely representative for purposes of describing example embodiments of the present invention. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Figure 5:
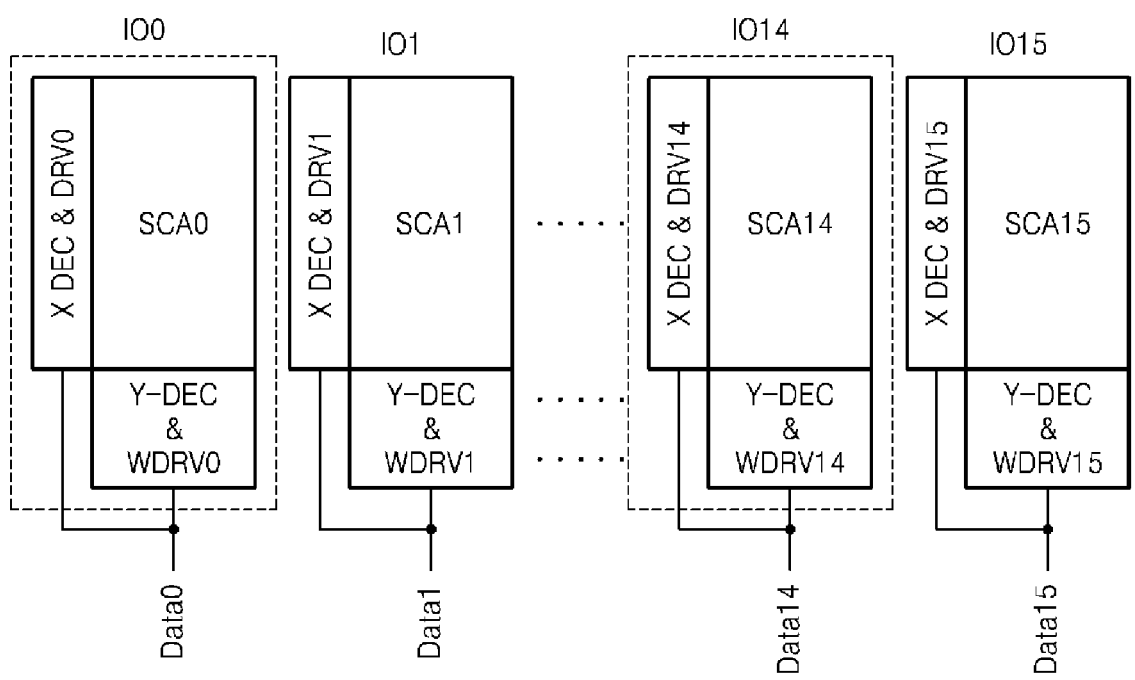
FIG. 5 is a schematic block diagram of a bi-directional RRAM, according to an exemplary embodiment of the present invention.

FIG. 5 is a schematic block diagram of a bi-directional resistive random access memory (RRAM) according to an exemplary embodiment of the present invention.

Referring to FIG. 5, multiple sub cell arrays SCA0 through SCAL5 include corresponding input/output lines IO0 through IO15, respectively. The sub cell arrays SCA0 through SCA15 also include corresponding X-decoders/drivers X DEC & DRV0 through X DEC & DRV15 and corresponding Y-decoders/drivers Y DEC & WDRV0 through Y DEC & WDRV15, respectively. For example, a first sub cell array SCA0 includes an input/output line IO0, an X-decoder/driver X DEC & DRV0 and a Y-decoder/driver Y DEC & WDRV0.

Because each of the sub cell arrays SCA0 through SCA15 includes an X-decoder/driver and a Y-decoder/driver which correspond to the input/output line of the sub cell array, data can be simultaneously written to all the input/output lines IO0 through IO15 of the RRAM. However, due to restrictions in the amount of electric current, for example, a system may adopt a scheme in which the writing operation is performed multiple times for the sixteen input/output lines IO0 through IO15. For example, the writing operation may be performed for times, four input/output lines at a time, in which case multiple sub cell arrays can be organized as illustrated in FIG. 6.

Figure 6:
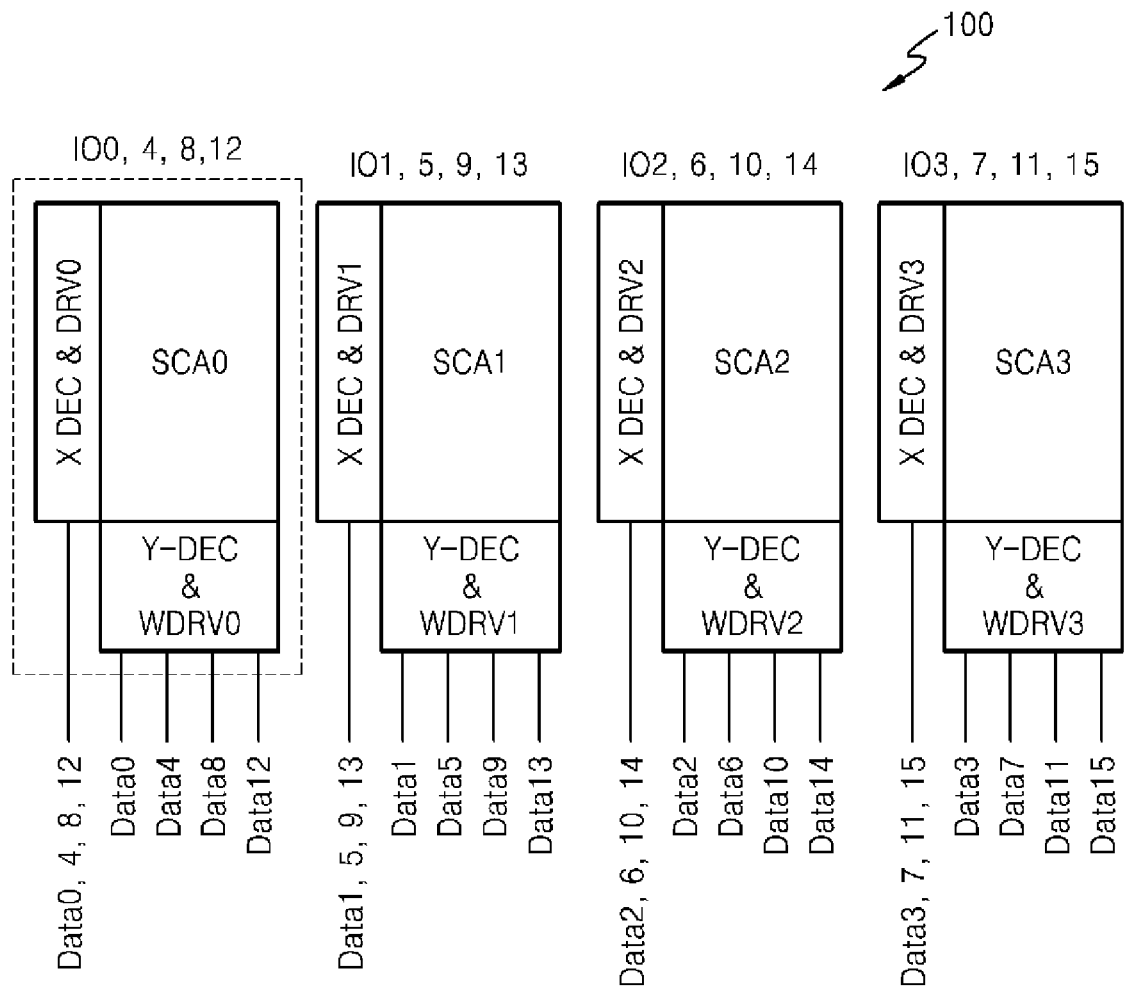
FIG. 6 is a schematic block diagram of a bi-directional RRAM, according to another exemplary embodiment of the present invention.
Figure 7:
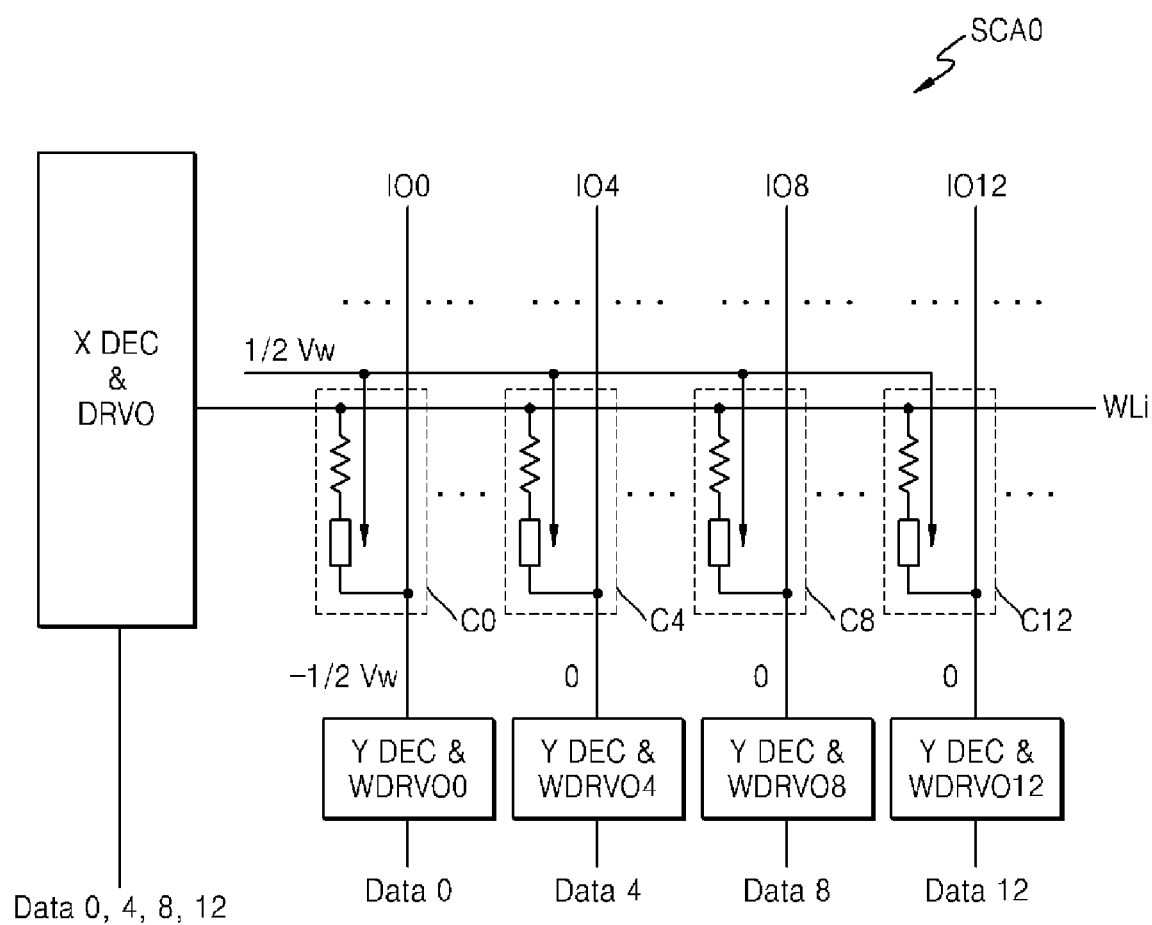
FIG. 7 is a detailed schematic block diagram of a sub cell array illustrated in FIG. 6, according to an exemplary embodiment of the present invention.

FIG. 6 is a schematic block diagram of a bi-directional RRAM 100 according to another exemplary embodiment of the present invention. FIG. 7 is a detailed view of a sub cell array SCA0 illustrated in FIG. 6, according to the exemplary embodiment of the present invention.

Referring to FIGS. 6 and 7, each cell of the bi-directional RRAM 100 includes a non-ohmic device and a resistance variable device, as discussed above. The non-ohmic device operates as a high-resistant material when voltages at both terminals of the cell are in a predetermined range, and operates as a low-resistant material when the voltages at both terminals of the cell are outside the predetermined range. When the non-ohmic device has a low resistance, the resistance variable device has a different resistance value in accordance with the polarities of both terminals of the cell. As the non-ohmic and resistance variable devices are described above, the descriptions will not be repeated here.

The bi-directional RRAM 100 includes a memory cell array having a predetermined number of sub cell arrays SCA0 through SCA3. The sub cell arrays SCA0 through SCA3 include corresponding X-decoders/drivers X DEC & DRV0 through X DEC & DRV3, respectively.

Each of the sub cell arrays SCA0 through SCA3 includes four input/output lines. The sub cell arrays SCA0 through SCA3 also include corresponding Y-decoders/drivers corresponding to the input/output lines of each sub cell array, respectively.

For example, a first sub cell array SCA0, illustrated in FIG. 7, includes an independent X-decoder/driver X DEC & DRV0, four input/output lines IO0, IO4, IO8 and IO12, four cells C0, C4, C8 and C12, and four Y-decoders/drivers Y DEC & WDRV00, Y DEC & WDRV04, Y DEC & WDRV08 and Y DEC & WDRV012, which respectively correspond to the input/output lines IO0, IO4, IO8 and IO12.

The bi-directional RRAM 100 illustrated in FIG. 6 simultaneously activates multiple input/output lines included in different sub cell arrays, and applies bias voltages to the activated input/output lines in accordance with data values which respectively correspond to the input/output lines. Also, the X-decoders/drivers activate multiple word lines and apply bias voltages to the activated word lines in accordance with the data values.

Here, the bias voltages correspond to writing voltages $V_W$ and $-V_W$. In the RRAM illustrated in FIG. 3A, for example, the bias voltages applied to the word line and the bit line are set as the ½ writing voltages $\frac{1}{2}V_W$ and $-\frac{1}{2}V_W$. In the RRAM illustrated in FIG. 3B, for example, the bias voltages applied to the word line and the bit line are set as the writing voltages $V_W$ and $-V_W$ or 0V.

The magnitudes of the writing voltages $V_W$ and $-V_W$ are the same and the polarities of the writing voltages $V_W$ and $-V_W$ are different, in accordance with the data values. For example, as described above, a writing voltage $V_W$ of 6V is necessary for writing a data value "0" and a writing voltage $-V_W$ of $-6V$ is necessary for writing a data value "1".

Figure 3:
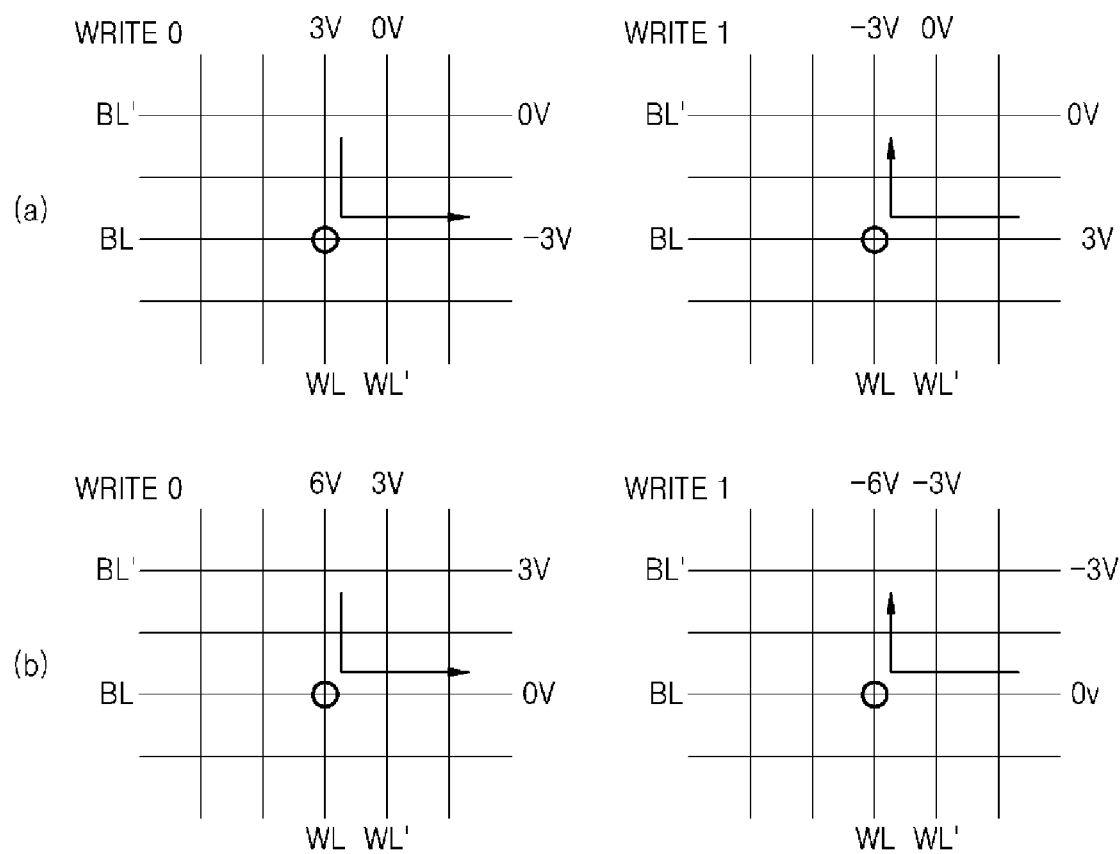
FIGS. 3A and 3B are schematic views illustrating operations of writing data to a cell of the conventional bi-directional RRAM illustrated in FIG. 1.
Figure 4:
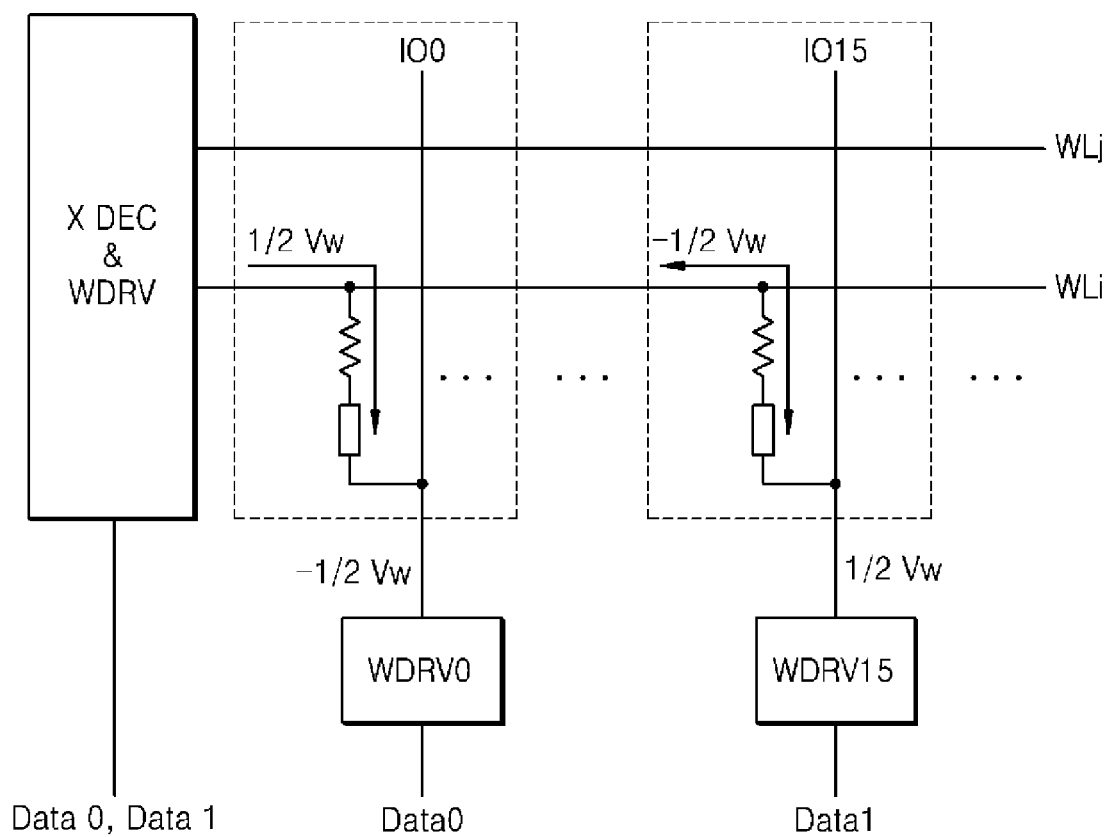
FIG. 4 is a schematic block diagram of a sub cell array illustrating the writing operation illustrated in FIG. 3A.

The drivers illustrated in FIG. 7 apply bias voltages in the same manner as illustrated in FIG. 3A. Accordingly, a bias voltage applied to the word line is the same magnitude as a bias voltage applied to the bit line, but the polarities of the bias voltages are different. For example, a data value "0" is written to the cell C0 connected to a first input/output line IO0 of the first sub cell array SCA0 by applying a ½ writing voltage $\frac{1}{2}V_W$ to a word line WLi, a ½ writing voltage $-\frac{1}{2}V_W$ to a bit line (the input/output line IO0) and 0V to unselected second through fourth input/output lines IO4, IO8 and IO12.

The first input/output lines IO1 through IO3 respectively corresponding to the second through fourth sub cell arrays SCA1 through SCA3 are simultaneously activated when the first input/output line IO0 of the first sub cell array SCA0 is activated. Different bias voltages may be applied to the first input/output lines IO0 through IO3 of first through fourth sub cell arrays SCA0 through SCA3 in accordance with the data values to be written, respectively.

Also, different bias voltages may be applied to the word lines of first through fourth sub cell arrays SCA0 through SCA3 in accordance with the data values to be written, respectively. That is, since the sub cell arrays SCA0 through SCA3 include independent X-decoders/drivers X DEC & DRV0 through X DEC & DRV3, respectively, different data values can be written to the cells respectively connected to the first input/output lines IO0 through IO3 of the first through fourth sub cell arrays SCA0 through SCA3.

After the bias voltages are applied to the first input/output lines IO0 through IO3 of the first through fourth sub cell arrays SCA0 through SCA3, second input/output lines IO4 through IO7 respectively corresponding to the first through fourth sub cell arrays SCA0 through SCA3 are simultaneously activated. As described above, different bias voltages may be applied to the word lines and the second input/output lines IO4 through IO7 of the first through fourth sub cell arrays SCA0 through SCA3 in accordance with the data values to be written, respectively.

Accordingly, bias voltages are simultaneously or sequentially applied to all input/output lines. Different data values can be written to all the input/output lines by performing the writing operation four times.

According to embodiments of the present invention, different data values can be simultaneously written to a non-volatile memory by including multiple sub cell arrays respectively having multiple X-decoders/drivers.

While the present invention has been particularly described with reference to exemplary embodiments, it will be apparent to those skilled in the art that various changes and modifications may be made without departing from the spirit and scope of the present invention. The exemplary embodiments should be considered in a descriptive sense only and not for purposes of limitation. Therefore, it should be understood that the above embodiments are not limiting, but illustrative.

What is claimed is:

1. A memory device, in which data values are determined by polarities at cell terminals, the memory device comprising:
    a memory cell array divided into a plurality of sub cell arrays, each sub cell array comprising at least one input/output line, a plurality of word lines and an X-decoder/driver,
    wherein each X-decoder/driver activates a word line and applies bias voltages to the activated word line in accordance with data values, for writing the data values on the sub cell array which corresponds to the X-decoder/driver, and
    wherein the memory device is a bi-directional resistive random access memory (RRAM).

2. The device of claim 1, wherein each sub cell array comprises one input-output line.

3. The device of claim 2, wherein each sub cell array further comprises a Y-decoder/driver corresponding to the one input/output line.

4. The device of claim 3, wherein the one input/output line included in each sub cell array is simultaneously activated, and bias voltages are applied to the activated input/output lines in accordance with the data values respectively corresponding to the input/output lines.

5. The device of claim 1, wherein each sub cell array comprises a plurality of input/output lines.

6. The device of claim 5, wherein each sub cell array further comprises a plurality of Y-decoders/drivers corresponding to the plurality of input/output lines.

7. The device of claim 6, wherein the plurality of input/output lines in each sub cell array comprises a first input/output line, and
    wherein the first input/output lines included in the plurality sub cell arrays are simultaneously activated, and bias voltages are applied to the activated first input/output lines in accordance with the data values respectively corresponding to the first input/output lines.

8. The device of claim 7, wherein the plurality of input/output lines included within each sub cell array are sequentially activated.

9. The device of claim 1, wherein each sub cell array comprises four input/output lines.

10. The device of claim 1, wherein the bias voltages correspond to writing voltages of the data values.

11. The device of claim 10, wherein magnitudes of the writing voltages are the same and polarities of the writing voltages are different.

12. The device of claim 1, wherein the bi-directional RRAM has a cell structure comprising:

a non-ohmic device which operates as a high-resistant material when voltages at the cell terminals are in a predetermined range and operates as a low-resistant material when the voltages at the cell terminals are outside the predetermined range; and a resistance variable device which has a different resistance value in accordance with the polarities at the cell terminals when the non-ohmic device has a low resistance.

13. A method of writing data to a bi-directional resistive random access memory (RRAM), in which data values are determined by polarities at cell terminals, the method comprising:

simultaneously activating a plurality of first input/output lines included in different sub cell arrays and applying bias voltages to the activated first input/output lines in accordance with the data values; and activating a plurality of word lines included in the different sub cell arrays and applying bias voltages to the activated word lines in accordance with the data values by an X-decoder/driver included in each sub cell array.

14. The method of claim 13, wherein each sub cell array comprises a plurality of input/output lines which share a plurality of word lines included in each sub cell array.

15. The method of claim 14, further comprising:

sequentially activating each of the plurality of input/output lines included in a sub cell array.

16. The method of claim 13, wherein each sub cell array comprises one input/output line.

17. The method of claim 13, wherein the bi-directional RRAM comprises:

a non-ohmic device which operates as a high-resistant material when voltages at the cell terminals are in a predetermined range and operates as a low-resistant material when the voltages at the cell terminals are outside the predetermined range; and a resistance variable device which has a different resistance value in accordance with the polarities at the cell terminals when the non-ohmic device has a low resistance.

* * * * *